(12) United States Patent
Toyomaki

(10) Patent No.: US 11,923,232 B2
(45) Date of Patent: Mar. 5, 2024

(54) POSITIONING APPARATUS, PROCESSING SYSTEM, AND POSITIONING METHOD

(71) Applicant: TOKYO ELECTRON LIMITED, Tokyo (JP)

(72) Inventor: Toshiaki Toyomaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 404 days.

(21) Appl. No.: 17/187,043

(22) Filed: Feb. 26, 2021

(65) Prior Publication Data

US 2021/0272783 A1 Sep. 2, 2021

(30) Foreign Application Priority Data

Feb. 27, 2020 (JP) ................. 2020-031948

(51) Int. Cl.
*H01L 21/687* (2006.01)
*H01J 37/32* (2006.01)
*H01L 21/68* (2006.01)

(52) U.S. Cl.
CPC .. *H01L 21/68742* (2013.01); *H01J 37/32642* (2013.01); *H01J 37/32715* (2013.01); *H01L 21/681* (2013.01)

(58) Field of Classification Search
CPC ........... H01J 37/32733; H01J 37/32642; H01J 37/32715; H01J 37/32935; H01L 21/67259; H01L 21/68; H01L 21/681; Y10S 414/136
USPC ........................................................ 414/936
See application file for complete search history.

(56) References Cited

U.S. PATENT DOCUMENTS

| | | | | |
|---|---|---|---|---|
| 5,885,353 A * | 3/1999 | Strodtbeck | ............ | B25B 11/005 118/712 |
| 6,190,113 B1* | 2/2001 | Bui | ................ | H01L 21/68742 414/217 |
| 6,555,164 B1* | 4/2003 | Yudovsky | ......... | H01L 21/68728 427/444 |
| 7,547,181 B2* | 6/2009 | Fukatsu | ............ | H01L 21/67259 700/59 |
| 7,857,569 B2* | 12/2010 | Hiroki | ............... | H01L 21/68742 414/217 |
| 8,398,777 B2* | 3/2013 | Collins | ............. | H01L 21/68785 118/728 |
| 8,461,022 B2* | 6/2013 | Koelmel | ................. | H01L 21/68 438/18 |
| 9,564,349 B2* | 2/2017 | Sorabji | ................... | C23C 16/46 |

(Continued)

FOREIGN PATENT DOCUMENTS

| | | |
|---|---|---|
| JP | 2004-47654 A | 2/2004 |
| JP | 2012-216614 A | 11/2012 |
| JP | 2017-092309 A | 5/2017 |

*Primary Examiner* — Gregory W Adams
(74) *Attorney, Agent, or Firm* — XSENSUS LLP

(57) ABSTRACT

A positioning apparatus includes a stage configured to hold a substrate, a first pin configured to hold an edge ring and a second pin separately provided from the first pin and configured to hold the edge ring. The positioning apparatus further includes a rotation mechanism configured to rotate the stage and the first pin, an elevating mechanism configured to raise and lower at least one of the first pin and the second pin and a detection mechanism configured to detect a position of an outer circumference of the substrate held by the stage and a position of an inner circumference of the edge ring held by the first pin.

12 Claims, 18 Drawing Sheets

(56) References Cited

U.S. PATENT DOCUMENTS

| | | | |
|---|---|---|---|
| 9,892,956 B1* | 2/2018 | Konkola | H01L 21/6875 |
| 2012/0327428 A1* | 12/2012 | Hellwig | H01L 21/681 |
| | | | 356/614 |
| 2018/0122657 A1* | 5/2018 | Patterson | G03F 7/7075 |
| 2019/0033103 A1* | 1/2019 | Sugita | H01J 37/32935 |

* cited by examiner

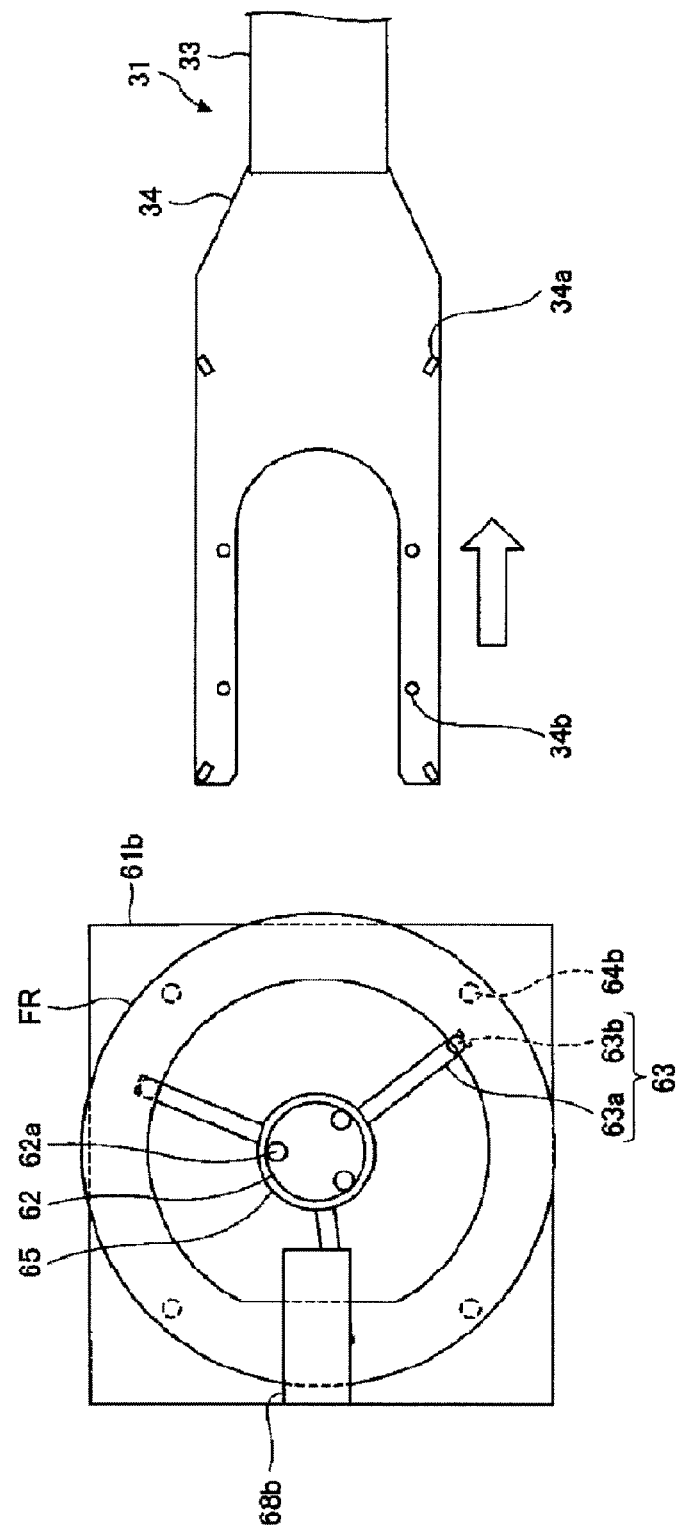

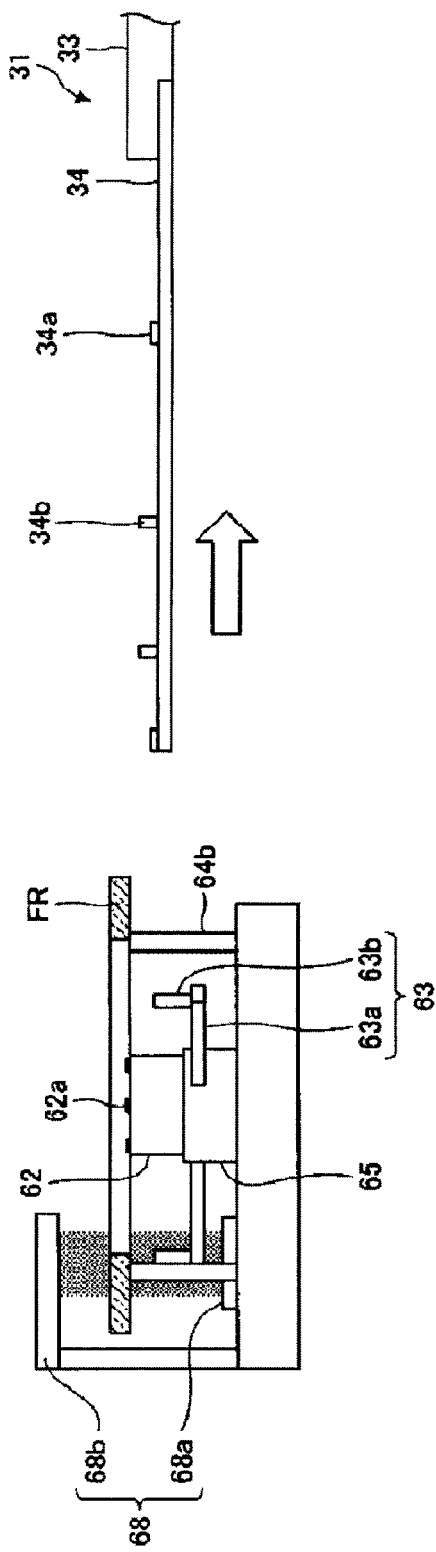

POSITIONING APPARATUS, PROCESSING SYSTEM, AND POSITIONING METHOD

CROSS-REFERENCE TO RELATED APPLICATIONS

This application claims priority to Japanese Patent Application No. 2020-031948, filed on. Feb. 27, 2020, the entire contents of which are incorporated herein reference.

TECHNICAL FIELD

The present disclosure relates to a positioning apparatus, a processing system, and a positioning method.

BACKGROUND

There is known a substrate positioning apparatus configured to perform positioning by detecting a position of a peripheral portion of a semiconductor wafer while rotating the semiconductor wafer and detecting a position of an orientation flat or a notch and detecting deviation of a center of the wafer from a center of rotation (see, e.g., Japanese Patent Application. Publication No. 2004-47654).

SUMMARY

The present disclosure provides a technique capable of positioning a substrate and an edge ring.

In accordance with an aspect of the present disclosure, there is provided an apparatus for positioning including: a stage configured to hold a substrate; a first pin configured to hold an edge ring; a second pin separately provided from the first pin and configured to hold the edge ring; a rotation mechanism configured to rotate the stage and the first pin; an elevating mechanism configured to raise and lower at least one of the first pin and the second pin; and a detection mechanism configured to detect a position of an outer circumference of the substrate held by the stage and a position of an inner circumference of the edge ring held by the first pin.

BRIEF DESCRIPTION OF THE DRAWINGS

The objects and features of the present disclosure will become apparent from the following description of embodiments, given in conjunction with the accompanying drawings, in which:

FIGS. 8A and 8B are process charts (3) showing the example of the method of positioning an edge ring;

DETAILED DESCRIPTION

Figure 1:
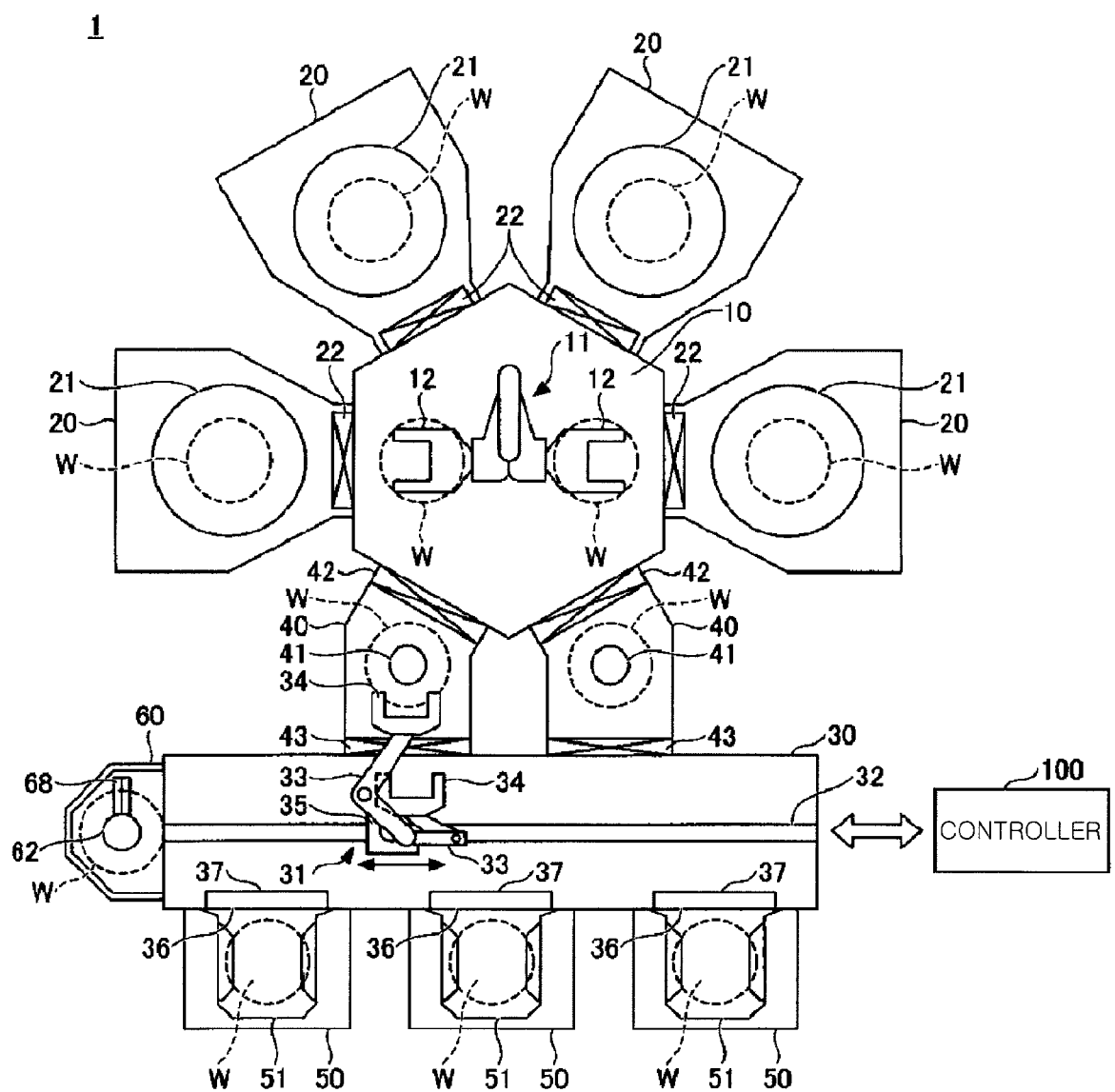
FIG. 1 shows a schematic configuration of a processing system according to an embodiment.

Hereinafter, non-limiting embodiments of the present disclosure will be described in detail with reference to the accompanying drawings. Like reference numerals will be given to like or corresponding parts throughout the drawings, and redundant description thereof will be omitted.

(Processing System)

An example of a processing system will be described with reference to FIG. 1. FIG. 1 shows a schematic configuration of the processing system according to an embodiment.

A processing system 1 includes a transfer module 10, process modules 20, a loader module 30, load-lock modules 40, and a controller 100. In the present embodiment, four process modules 20 and two load-lock modules 40 are provided. However, the number of the process modules 20 and the number of the load-lock modules 40 are not limited thereto.

The transfer module 10 has a substantially hexagonal shape in plan view. The transfer module 10 is a vacuum chamber and has a transfer device 11 therein. The transfer device 11 is a multi-joint arm that can be extended/contracted, raised/lowered, and rotated to access the process modules 20 and the load-lock modules 40. The transfer device 11 has two picks 12 that can be extended/contracted independently in opposite directions, and thus can transfer two wafers h at a time. The transfer device 11 may transfer the wafers W between the process modules 20 and the load-lock modules 40. The configuration of the transfer device 11 is not limited to that shown in FIG. 1.

The process modules 20 are connected to the transfer module 10 while being arranged radially around the transfer module 10. Each of the process modules 20 is a processing chamber, and has therein a cylindrical substrate support 21 for placing a wafer W thereon. In each of the process modules 20, various semiconductor manufacturing processes are performed on the wafer W placed on the substrate support 21. The semiconductor manufacturing processes include various processes for manufacturing a semiconductor, such as film formation, etching, heat treatment, and the like. The transfer modules 10 and the process modules 20 are partitioned by openable and closeable gate valves 22.

The loader module 30 is disposed to be opposed to the transfer module 10. The loader module 30 is a rectangular parallelepiped atmospheric transfer chamber maintained in an atmospheric pressure atmosphere. A transfer device 31 is disposed in the loader module 30. The transfer device 31 is slidably supported on a guide rail 32 extending along a long side at a central portion of the loader module 30. A linear motor (not shown) having an encoder, for example, is built in the Guide rail 32, and the transfer device 31 moves along the guide rail 32 by driving the linear motor.

The transfer device 31 has two multi-joint arms 33 arranged in two horizontal stages. A bifurcated pick 34 is attached to a tip end of each of the multi-joint arms 33. A wafer W is held on each pick 34. Each of the multi-joint arm 33 can be extended/contracted in a radial direction from a center thereof and raised/lowered. The extension/contraction of the multi-joint arms 33 can be individually controlled. The rotation axes of the multi-joint arms 33 are coaxially and rotatably connected to a base 35. For example, the multi-joint arms 33 rotate integrally in a rotational direction with respect to the base 35. The guide rail 32 and the multi-joint arm 33 function as a driving mechanism for moving the pick 34. The transfer device 31 transfers the wafer W between the load-lock modules 40, a transfer container 51, and an aligner 60 that will be described later. The configuration of the transfer device 31 is not limited to that shown in FIG. 1 as long as the wafer W can be transferred between the load-lock modules 40, the transfer container 51, and the aligner 60.

The two load-lock modules 40 are connected to one long side surface of the loader module 30. One or multiple loading/unloading ports 36 for introducing the wafer W are disposed at the other long side surface of the loader module 30. In the illustrated example, three loading/unloading ports 36 are disposed. An opening/closing door 37 is disposed at each of the loading/unloading ports 36. Further, a load port 50 is disposed to correspond to each of the loading/unloading ports 36. The transfer container 51 for accommodating and transferring the wafer W is placed on the load port 50. The transfer container 51 may be a front-opening unified pod (FOUP) that holds and accommodates a plurality of (e.g., 25) wafers W in multiple stages at predetermined intervals.

The aligner 60 is connected to one short side surface of the loader module 30. The aligner 60 positions the wafer W and the edge ring FR. The aligner 60 has a wafer holder 62. The wafer holder 62 has a diameter smaller than that of the wafer W, and is configured to be rotatable with the wafer W placed thereon. A detection mechanism 68 for detecting an outer circumference of the wafer W and an inner circumference of the edge ring FR is disposed at an outer circumference of the wafer holder 62. The aligner 60 positions the wafer P by detecting the outer circumference of the wafer W using the detection mechanism 68, and positions the edge ring FR by detecting the inner circumference of the edge ring FR using the detection mechanism 68. FIG. 1 shows a state in which the wafer P is placed on the upper surface of the wafer holder 62. The aligner 60 will be described in detail later.

The load-lock modules 40 are disposed between the transfer module 10 and the loader module 30. The load-lock module 40 is configured as an inner pressure variable chamber of which inner atmosphere can be switched between a vacuum state and an atmospheric pressure, and has therein a cylindrical stage 41 for placing a wafer W thereon. The stage 41 has a diameter smaller than that of the wafer W. In the case of loading the wafer W from the loader module 30 into the transfer module 10, the wafer W is transferred from the loader module 30 into the load-lock module 40 maintained at an atmospheric pressure; the pressure in the load-lock module 40 is decreased; and the wafer is loaded into the transfer module 10. In the case of unloading the wafer W from the transfer module 10 into the loader module 30, the wafer W is transferred from the transfer module 10 into the load-lock module 40 maintained in a vacuum state; the pressure in the load-lock module 40 is increased to an atmospheric pressure; and the wafer W is loaded into the loader module 30. The load-lock module 40 and the transfer module 10 are partitioned by an openable/closeable gate valve 42. Further, the load-lock module 40 and the loader module 30 are partitioned by an openable/closable gate valve 43.

Figure 2:
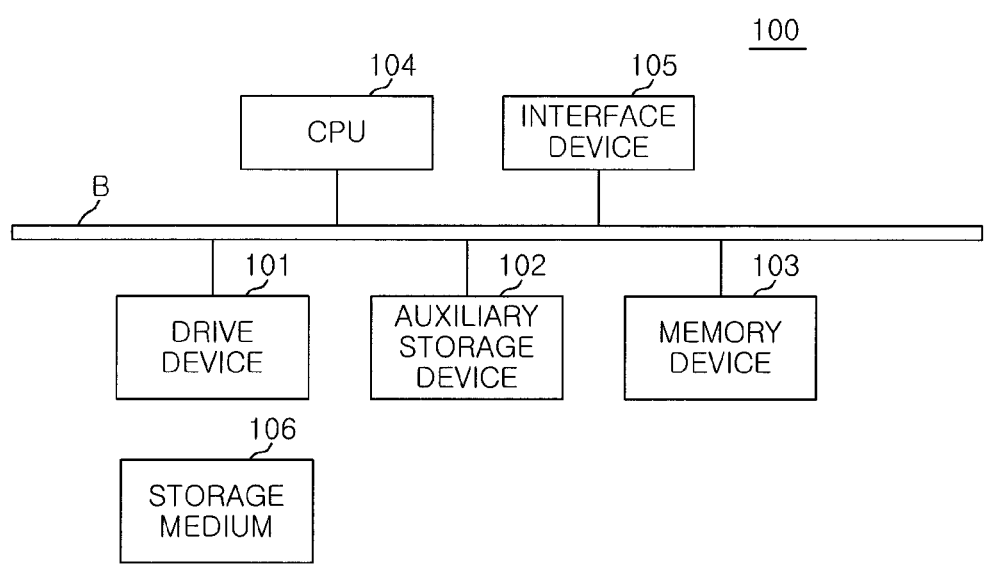
FIG. 2 shows an example of a hardware configuration of a controller.

The controller 100 controls the operations of the respective components of the processing system 1. As shown in FIG. 2, the controller 100 is a computer including a drive device 101, an auxiliary storage device 102, a memory device 103, a CPU 104, an interface device 105, and the like that are connected to each other by a bus B. A program that realizes the processing in the controller 100 is provided by a storage medium 106 such as a CD-ROM or the like. When the storage medium 106 that stores the program is set in the drive device 101, the program is installed in the auxiliary storage device 102 from the storage medium 106 via the drive device 101. The program is not necessarily installed from the storage medium 106, and may be downloaded from another computer through a network. The auxiliary storage device 102 stores necessary data such as installed programs, recipes, and the like. The memory device 103 reads the program from the auxiliary storage device 102 and stores the program therein when there is an instruction for starting the program. The CPU 104 executes a function of the processing system 1 based on the program stored in the memory device 103. The interface device 105 is used as an interface for connection to the network.

(Wafer and Edge Ring)

Figure 3A:
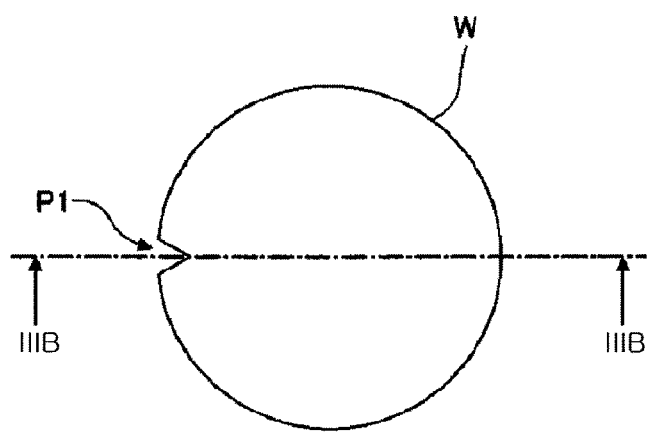
FIGS. 3A and 3B show an example of a wafer.
Figure 3B:
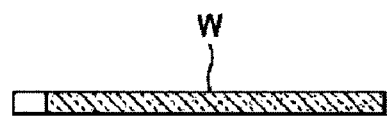

An example of the wafer W will be described with reference to FIGS. 3A and 3B. FIGS. 3A and 3B show an example of the wafer W. FIG. 3A is a top view of the wafer W, and FIG. 3B shows a cross section of the wafer W taken along a cutting line IIIB-IIIB in FIG. 3A.

The wafer W has a disc shape and may be semiconductor wafer such as a silicon wafer or the like. A position specifying portion P1 indicating a crystal axis direction is disposed at an outer circumference of the wafer W. In the present embodiment, the position specifying portion P1 is a notch. However, the position specifying portion P1 may be a straight portion. (orientation flat).

Figure 4A:
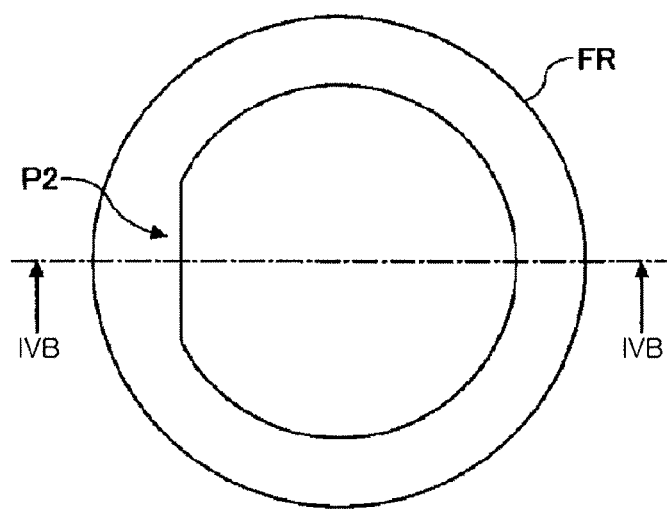
FIGS. 4A and 4B show an example of an edge ring.
Figure 4B:
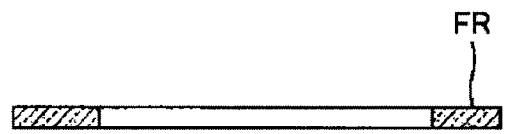

An example of the edge ring FR will be described with reference to FIGS. 4A and 4B. FIGS. 4A and 4B show an example of the edge ring FR. FIG. 4A is a top view of the edge ring FR, and FIG. 4B shows a cross section of the edge ring FR taken along a cutting line IVB-IVB in FIG. 4A.

The edge ring FR has an annular plate shape and is made of, e.g., the same material as that of the wafer W. The edge ring FR is disposed to surround the wafer H on the substrate support 21 in the process module 20. The edge ring FR improves the uniformity of plasma processing (e.g., etching) on the surface of the wafer W. A position specifying portion P2 is disposed at an inner circumference of the edge ring FR. In the present embodiment, the position specifying portion P2 is a straight portion (orientation flat). However, the position specifying portion P2 may be a notch.

(Aligner)

Figure 5A:
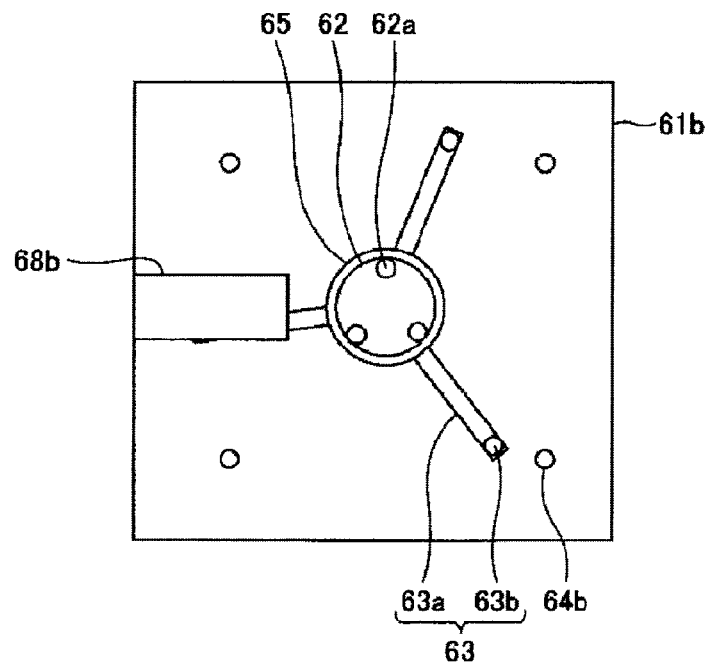
FIGS. 5A and 5B show an example of an aligner.
Figure 5B:
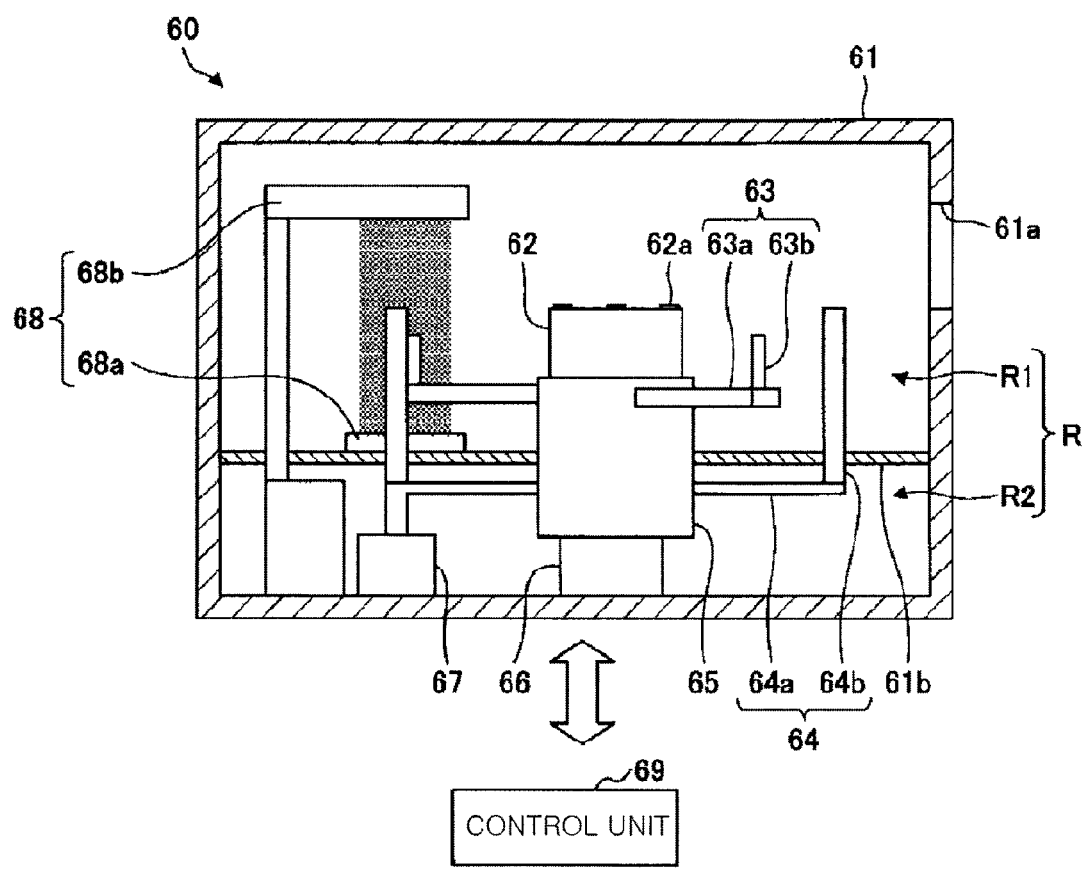

An example of the aligner 60 in the processing system 1 will be described with reference to FIGS. 5A and 5B. FIGS. 5A and 5B show an example of the aligner 60. FIG. 5A is a top view of the aligner 60, and FIG. 5B shows a cross section of the aligner 60. In FIG. 5A, a ceiling portion of a housing 61 is not illustrated for convenience of description.

The aligner 60 includes the housing 61, the wafer holder 62, an FR holding unit 63, an FR elevating unit 64, a driving shaft 65, a rotation mechanism 66, an elevating mechanism 67, a detection mechanism 68, and a control unit 69.

The housing 61 has therein a positioning space R capable of accommodating the wafer a and the edge ring FR. An opening 61a for loading/unloading the wafer F and the edge ring FR is formed on a sidewall of the housing 61. Further, the housing 61 has a partition plate 61b for partitioning a first space R1 and a second space R2. The first space R1 is a chamber for positioning the wafer W and the edge ring FR. The second space R2 is disposed below the first space R1 and has therein the rotation mechanism 66 and the elevating mechanism 67.

The wafer holder 62 holds the wafer W on the upper surface thereof. The wafer holder 62 is formed in cylindrical shape having a diameter smaller than that of the wafer W. The rotation mechanism 66 is connected to a bottom surface of the wafer holder 62 through the driving shaft 65. On the upper surface of the wafer holder 62, a plurality of (e.g., three) holding pads 62a are disposed at equal intervals near the peripheral portion of the wafer holder 62. The holding pad 62a is, e.g., an O-ring that is fitted in a groove (not shown) formed on the upper surface of the wafer holder 62 and detachably fixed to the wafer holder 62.

The FR holding unit 63 includes three FR holders 63a and three FR holding pads 63b. Each of the FR holders 63a has an arm shape extending outward from an outer peripheral surface of the driving shaft 65. One end of the FR holder 63a is connected to the driving shaft 65. Accordingly, the FR holder 63a is integrally rotated with the wafer holder 62 by the rotation mechanism 66. The three FR holders 63a are arranged at equal intervals in the circumferential direction of the driving shaft 65. The FR holding pad 63b projects upward from the upper surface of the other end of the FR holder 63a to hold the edge ring. FR at the upper end thereof. The upper end of the FR holding pad 63b is preferably located below the upper surface of the wafer holder 62. Accordingly, when the wafer W is held by the wafer holder 62 in a state where the center of the wafer W is deviated from the center of the wafer holder 62 or when the wafer W is moved in the horizontal direction by the rotation of the wafer holder 62, it is possible to prevent the interference between the FR holding pad 63b and the wafer W. In the present embodiment, three FR holding bases 63a are connected to the driving shaft 65. However, four or more FR holders 63a may be connected to the driving shaft 65.

The FR elevating unit. 64 includes an elevating plate 64a and four FR elevating pins 64b. The elevating plate 64a is connected to the elevating mechanism 67 and raised/lowered moved by the elevating mechanism 67. The FR elevating pins 64b project upward from the upper surface of the elevating plate 64a to hold the edge ring FR at the upper ends thereof. The FR elevating pins 64b are configured such that the upper ends thereof are raised and lowered within a range including the height position of the upper end of the FR holding pad 63b. Further, it is preferable that the FR elevating pins 64b are raised and such that the upper ends thereof are located below the upper surface of the wafer holder 62. Accordingly, when the wafer W is held by the wafer holder 62 in a state where the center of the wafer W is deviated from the center of the wafer holder 62, or when the wafer W is moved in the horizontal direction by the rotation of the wafer holder 62, it is possible to prevent the interference between the FR elevating pin 64b and the wafer W. In the present embodiment, the elevating plate 64a is provided with four FR elevating pins 64b. However, the elevating plate 64a may be provided with three FR elevating pins 64b, or may be provided with five or more FR elevating pins 64b.

The upper end of the driving shaft 65 is connected to the bottom surface of the wafer holder 62, and the lower end of the driving shaft 65 is connected to the rotation mechanism 66. The driving shaft 65 transmits the rotational force of the rotating mechanism 66 to the wafer holder 62. The FR holders 63a is connected to the outer peripheral surface of the driving shaft 65, and the driving shaft 65 transmits the rotational force of the rotating mechanism 66 to the FR holders 63a. In other words, the driving shaft 65 rotatably holds the wafer holder 62 and the FR holding unit 63.

The rotation mechanism 66 integrally rotates the wafer holder 62 and the FR holding unit 63 through the driving shaft 65. The rotation mechanism 66 is disposed in the second space R2.

The elevating mechanism 67 raises and lowers the FR elevating pins 64b through the elevating plate 64a. The elevating mechanism 67 is disposed in the second space R2.

The detection mechanism 68 detects the position of the outer circumference of the wafer W held by the wafer holder 62 and the position of the inner circumference of the edge ring FR held by the FR holding pad 63b. The detection mechanism 68 includes a light emitting unit 68a and a light receiving unit 68b. The light emitting unit 68a is a light source such as a light emission diode (LED) or the like. The light receiving unit 68b is a CCD sensor or the like, and is disposed to face the light emitting unit 68a horizontally. The detection mechanism 68 is configured such that a part of the light from the light emitting unit 66a is blocked by the wafer W or the edge ring FR and the remaining light is incident on the light receiving unit 68b. The detection mechanism 68 transmits the detection signal to the control unit 69.

The control unit 69 is, e.g., a CPU. The control unit 69 controls the rotation mechanism 66 to rotate the wafer W substantially once. At this time, the position specifying portion P1 formed at the outer circumference of the wafer U is detected from the change in the amount of light incident on the light receiving unit 68b of the detection mechanism 68. Further, the control unit 69 detects the deviation (eccentricity) of the center of the wafer W from the center of rotation of the wafer holder 62 from the change in the amount of light. Further, the control unit 69 controls the rotation mechanism 66 to rotate the edge ring FR substantially once. At this time, the position specifying portion 92 formed at the inner circumference of the edge ring FR is detected from the change in the amount of light incident on the light receiving unit 68b of the detection mechanism 68. Further, the control unit 69 detects the deviation (eccentricity) of the center of the edge ring FR from the center of rotation of the FR holding unit 63 from the change in the amount of light. Although the case where the control unit 69 controls the respective components of the aligner 60 has been described in the present embodiment, the controller 100 of the processing system. 1 may control the respective components of the aligner 60, instead of the control unit 69.

(Method of Positioning Edge Ring)

An example of a method of positioning the edge ring FR according to art embodiment will be described with reference to FIGS. 6A to 11. The method of positioning the edge ring FR according to an embodiment is performed when the edge ring FR used in the process module 20 is replaced with a new edge ring FR, for example. FIGS. 6A to 10B are process charts showing an example of the method of positioning the edge ring FR. FIGS. 6A, 7A, 6A, 9A and 10A are top views of the aligner 60, and FIGS. 6B, 7B, 8B, 9B and 10B show cross sections of the aligner 60. In FIGS. 6A to 10B, the housing 61, the elevating plate 64a, the rotating mechanism 66, the elevating mechanism 67, and the control unit 69 are not shown for convenience of description.

First, the control unit 69 controls the rotation mechanism. 66 to rotate the FR holding unit 63 through the driving shaft 65, so that the FR holding pad 63b is moved to a position where it does not interfere with the pick 34 of the transfer device 31 that enters the aligner 60. When the FR holding pad. 63*b* is located at a position where it does not interfere with the pick 34, the rotation of the FR holding pad 63*b* may be omitted.

Figure 6A:
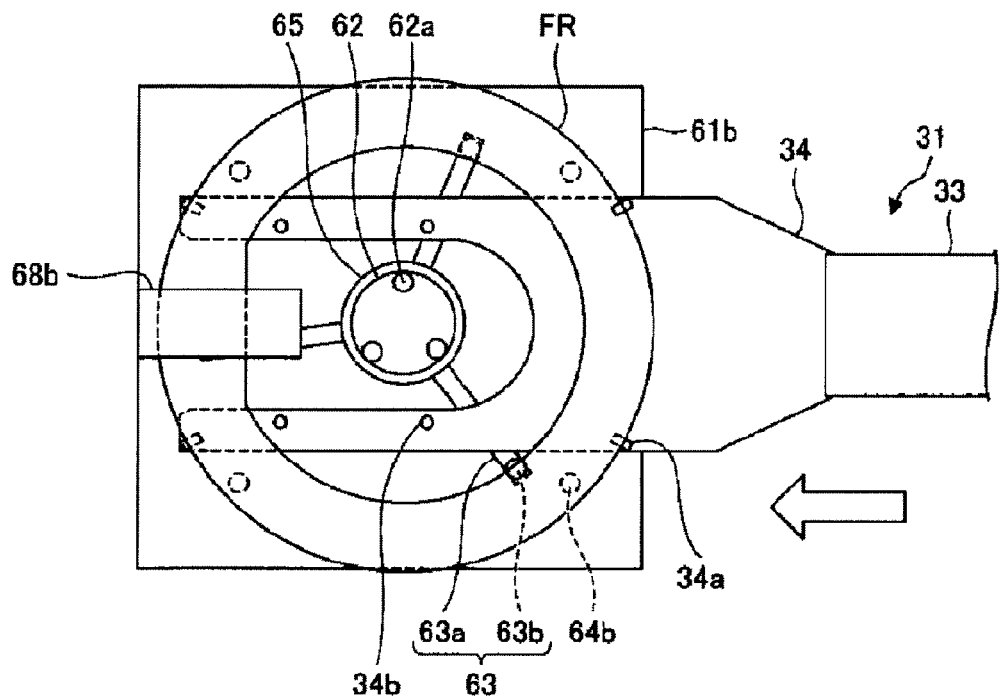
FIGS. 6A and 6B are process charts (1) showing an example of a method of positioning an edge ring.
Figure 6B:
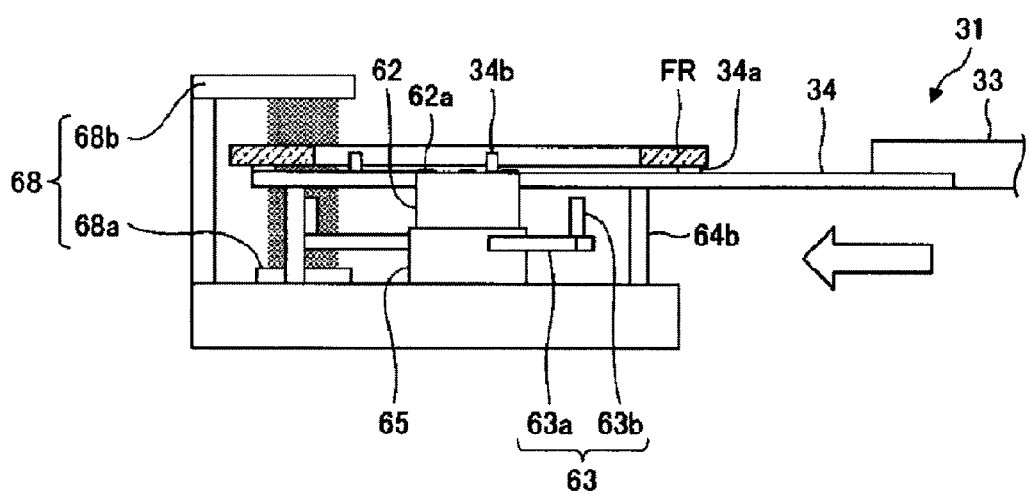

Then, the controller 100 controls the transfer device 31 to extend the multi-joint arm 33 so that the pick 34 holding the edge ring FR enters the aligner 60 (see FIGS. 6A and 6B). In the present embodiment, the edge ring FR is placed on the pick 34 and the outer circumference thereof is held by four claw portions 34*a*.

Figure 7A:
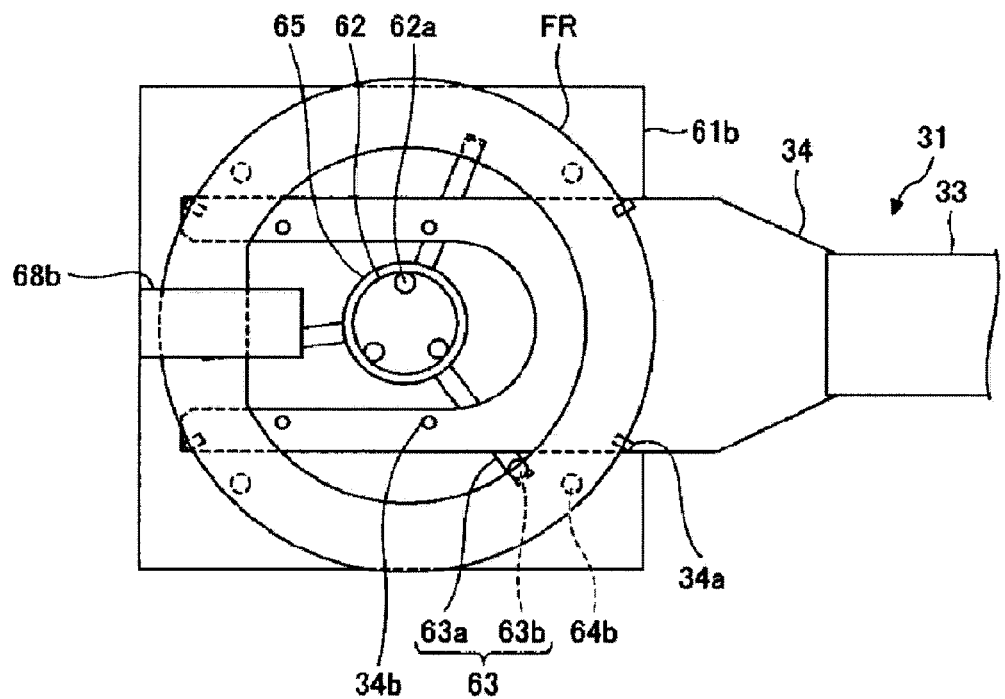
FIGS. 7A and 7B are process charts (2) showing the example of the method of positioning an edge ring.
Figure 7B:
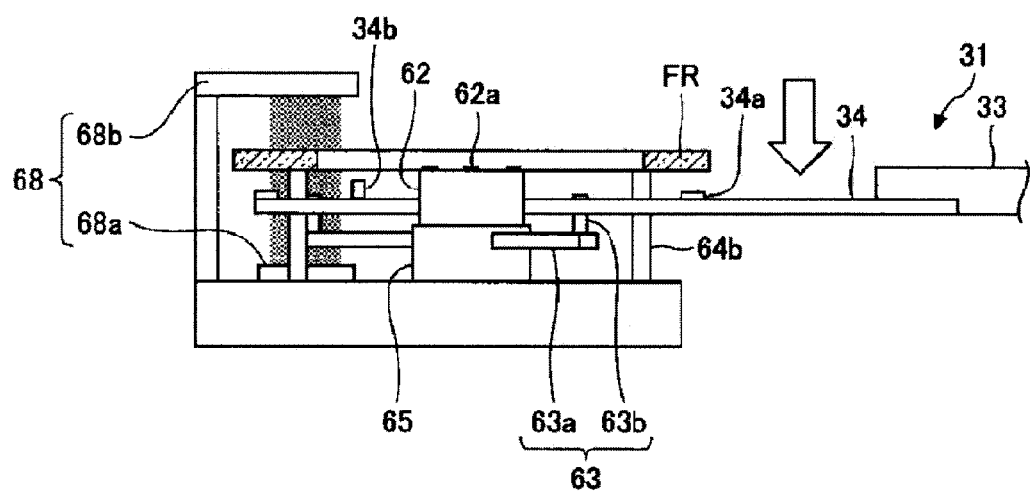

Then, the controller 100 controls the transfer device 31 to lower the pick 34 in the aligner 60 so that the edge ring FR is placed on the upper ends of the FR elevating pins 64*b* (see FIGS. 7A and 7B).

Then, the controller 100 controls the transfer device 31 to contract the multi-joint arm 33 so that the pick 34 is moved to the outside of the aligner 60 (see FIGS. 6A and 8B).

Figure 9A:
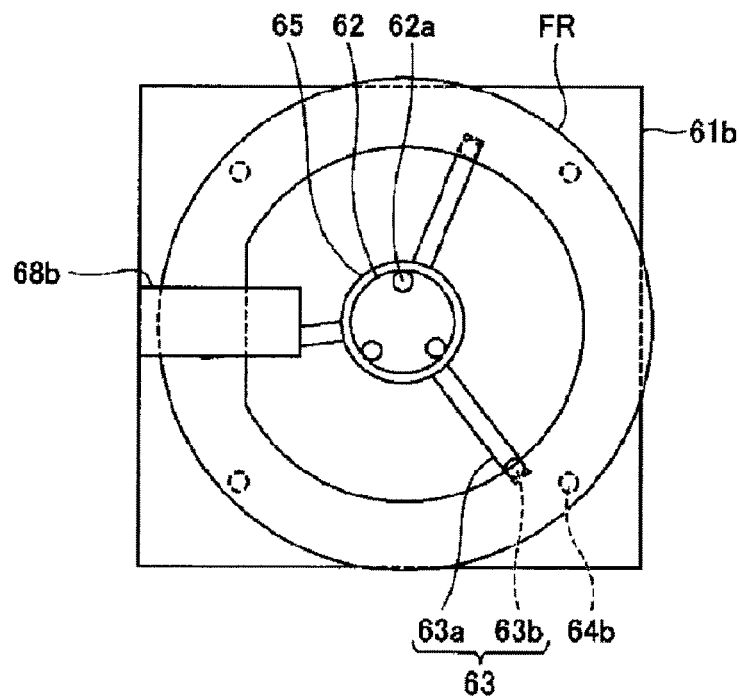
FIGS. 9A and 9B are process charts (4) showing the example of the method of positioning an edge ring.
Figure 9B:
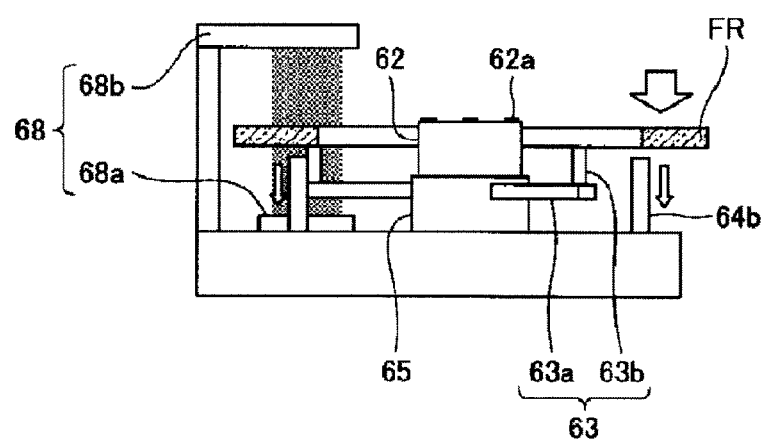

Then, the control unit 69 controls the elevating mechanism 67 to lower the FR elevating pin 64*b* until the upper ends of the FR elevating pins 64*b* are located below the upper end of the FR holding pad 63*b* so that the edge ring FR is delivered to the FR holding pad 63*b* (see FIGS. 9A and 9B).

Figure 10A:
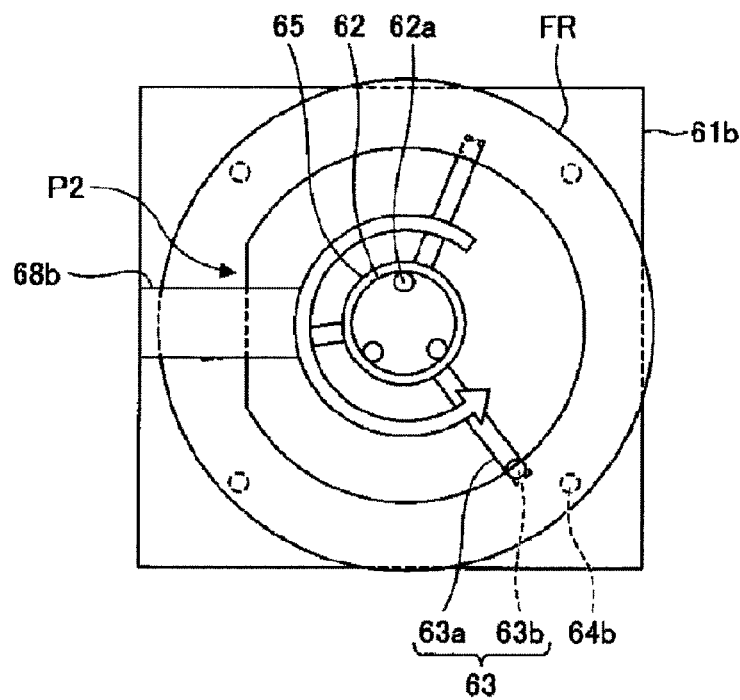
FIGS. 10A and 10B are process charts (5) showing the example of the method of positioning an edge ring.
Figure 10B:
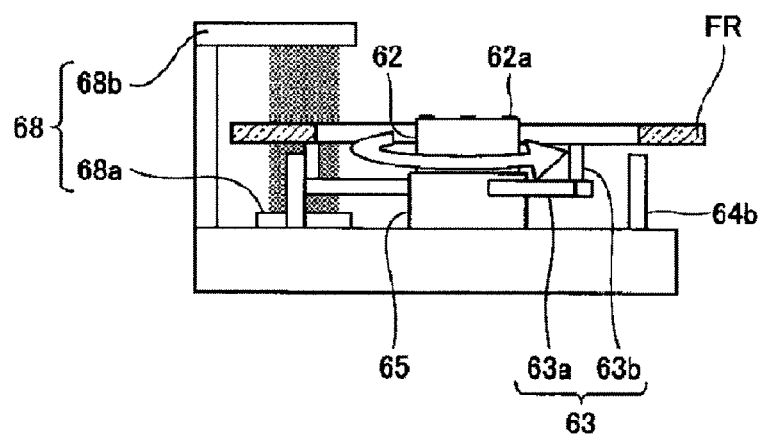

Then, the control unit 69 controls the rotation mechanism 66 to rotate the FR holding unit 63 through the driving shaft 65 so that the edge ring FR rotates substantially once (see FIGS. 10A and 10B). Further, the control unit 69 detects the position specifying unit P2 formed at the inner circumference of the edge ring FR from the change in the amount of light incident on the light receiving unit 68*b* of the detection mechanism 68 at the time of rotating the edge ring FR substantially once. Further, the control unit 69 detects the deviation (eccentricity) of the center of the edge ring FR from the center of rotation of the FR holding unit 63 from the change in the amount of light.

Figure 11:
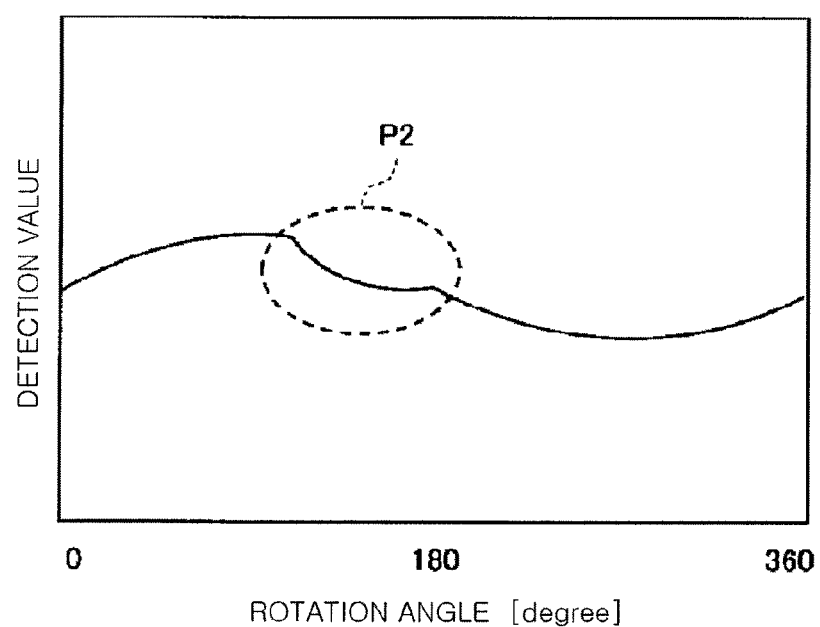
FIG. 11 explains an example of a detection signal in the case of detecting an inner circumference of the edge ring.

FIG. 11 explains an example of a detection signal in the case of detecting the inner circumference of the edge ring FR. In FIG. 11, the vertical axis represents a detection value of the detection signal, and the horizontal axis represents a rotation angle [degree] of the edge ring FR. When the edge ring FR is placed on the FR holding pad. 63*b* in a state where the center of the edge ring FR is deviated from the center of rotation of the FR holding unit 63, a signal detected by the detection mechanism 68 at the time of rotating the edge ring FR substantially once changes like a sinusoidal waveform (see FIG. 11). Further, the signal detected by the detection mechanism 68 changes in a different manner from that of the sinusoidal waveform due to the position specifying portion P2 of the edge ring FR. The circumferential position of the edge ring FR is detected by detecting the rotational position of the driving shaft 65 using an encoder (not shown). The control unit 69 calculates the position of the position specifying unit 82 (rotational position) and an eccentric amount and an eccentric direction of the center of the edge ring FR from the center of rotation of the FR holding unit 63 based on the detection signal from the detection mechanism 68.

Then, the control unit 69 rotates the edge ring FR such that the position specifying unit 92 of the edge ring FR faces a predetermined direction. Further, the control unit 69 transmits the calculated eccentric amount and the calculated eccentric direction to the controller 100.

Then, the control unit 69 controls the elevating mechanism 67 to raise the FR elevating pins 64*b* until the upper ends of the FR elevating pins 64*b* are located above the upper end of the FR holding pad 63*b*. Accordingly, the edge ring FR is delivered from the FR holding pad. 63*b* to the FR elevating pins 64*b*.

Then, the control unit. 69 controls the rotation mechanism 66 to rotate the FR holding unit 63 through the driving shaft 65 so that the FR holding pad 63*b* is moved to a position where it does not interfere with the pick 34 of the transfer device 31 that enters the aligner 60. When the FR holding pad. 63*b* is located at a position where it does not interfere with the pick 34, the rotation of the FR holding pad 63*b* may be omitted.

Then, the controller 100 corrects the entering position of the pick 34 with respect to the aligner 60 such that the center of the transfer device 31 and the center of the edge ring FR coincide with each other based on the eccentric amount and the eccentric direction received from the control unit 69. Then, the controller 100 causes the pick 34 of the transfer device 31 to enter the corrected entering position in the aligner 60 and receive the edge ring FR held by the FR elevating pins 64*b*.

Then, the controller 100 controls the transfer device 31 to contract the multi-joint arm 33 so that the pick 34 holding the edge ring FR is moved to the outside of the liner 60 and the edge ring FR is unloaded from the aligner 60.

In accordance with the method of positioning the edge ring FR, the edge ring FR can be positioned by the aligner 60. In the present embodiment, the case where the edge ring FR held by the pick 34 is placed on the FR elevating pins 64*b* and transferred from the FR elevating pins 64*b* to the FR holding pad 63*b* has been described. However, the present disclosure is not limited thereto, and the edge ring FR held by the pick 34 may be directly delivered to the FR holding pad 63*b*, for example.

(Method of Positioning Wafer)

An example of a method of positioning the wafer H according to an embodiment will be described with reference to FIGS. 12A to 16. The method of positioning the wafer H according to an embodiment is performed before the wafer H to be processed in the process module 20 is loaded into the load-lock module 40, for example. FIGS. 12A to 15B are process charts showing an example of the method of positioning the wafer W. FIGS. 12A, 13A, 14A and 15A are top view of the aligner 60, and FIGS. 12B, 13B, 14B, and 15B show cross sections of the aligner 60. In FIGS. 12A to 15B, the housing 61, the elevating plate 64*a*, the rotating mechanism 66, the elevating mechanism 67, and the control unit 69 are not shown for convenience of description.

First, the control unit 69 controls the rotation mechanism. 66 to rotate the FR holding unit 63 through the driving shaft 65, so that the FR holding pad 63*b* is moved to a position where it does not interfere with the pick 34 of the transfer device 31 that enters the aligner 60. When the FR holding pad. 63*b* is located at a position where it does not interfere with the pick 34, the rotation of the FR holding pad 63*b* may be omitted.

Figure 12A:
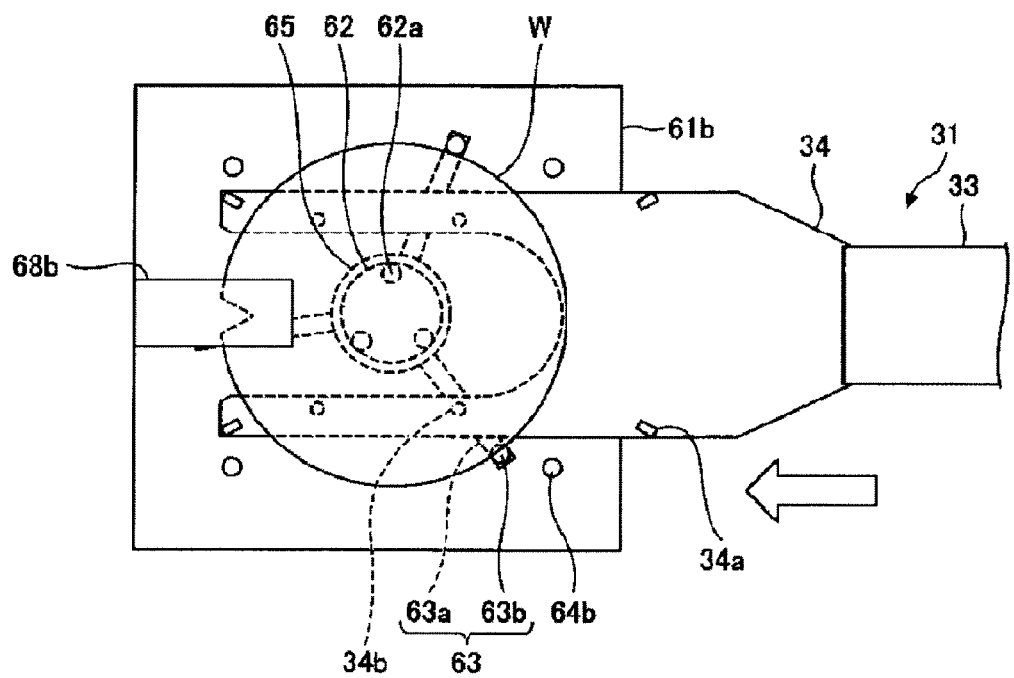
FIGS. 12A and 12B are process charts (1) showing an example of a method of positioning a wafer.
Figure 12B:
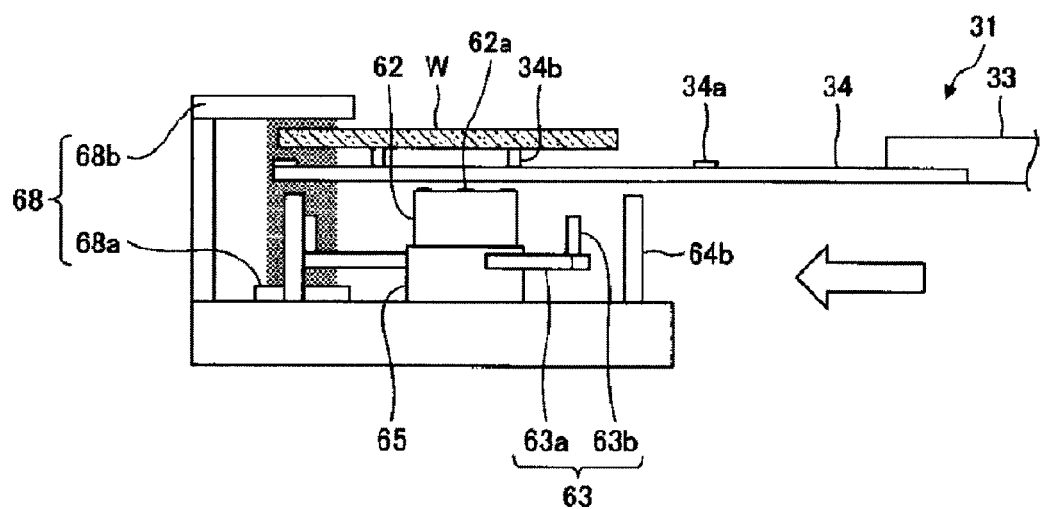

Then, the controller 100 controls the transfer device 31 to extend the multi-joint arm 33 to allow the pick 34 holding the wafer W to enter the aligner 60 (see FIGS. 12A and 12B). In the present embodiment, the wafer W is placed on four pads 34*b* disposed on the upper surface of the pick 34.

Figure 13A:
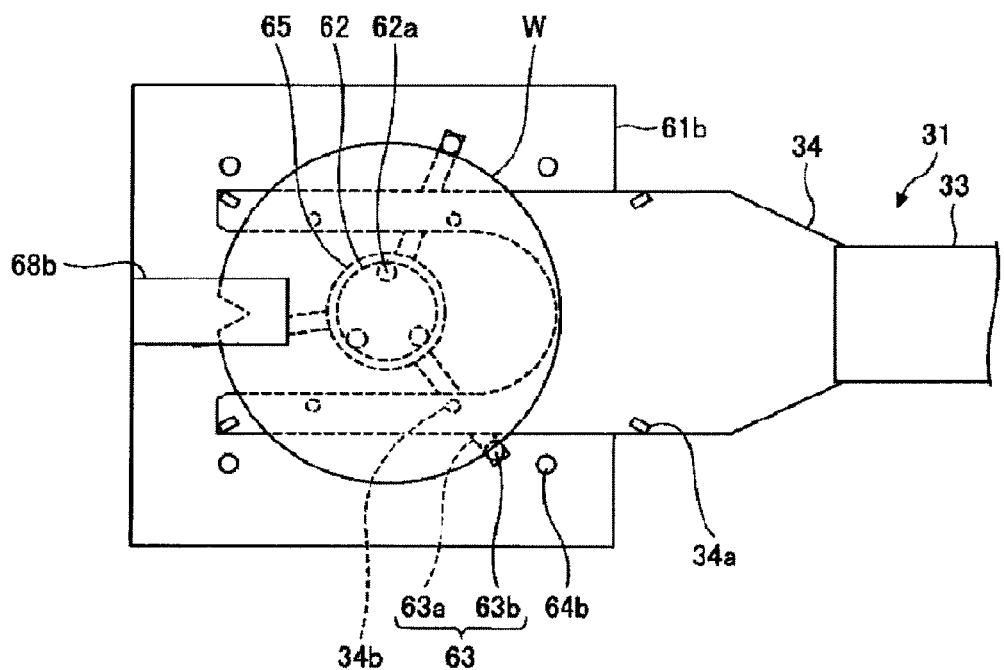
FIGS. 13A and 13B are process charts (2) showing the example of the method of positioning a wafer.
Figure 13B:
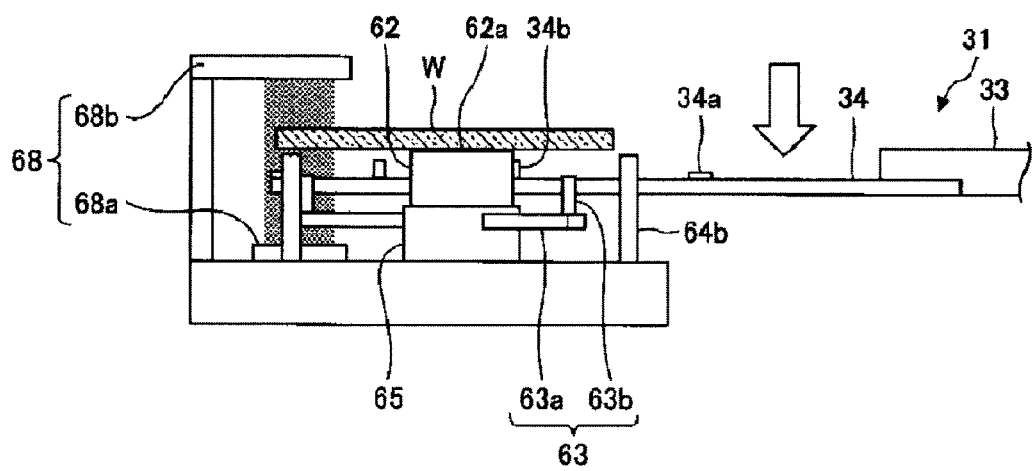

Then, the controller 100 controls the transfer device 31 to lower the pick 34 in the aligner 60 so that the wafer W is placed on the holding pad 62*a* disposed on the upper surface of the wafer holder 62 (see FIGS. 13A and 13B).

Figure 14A:
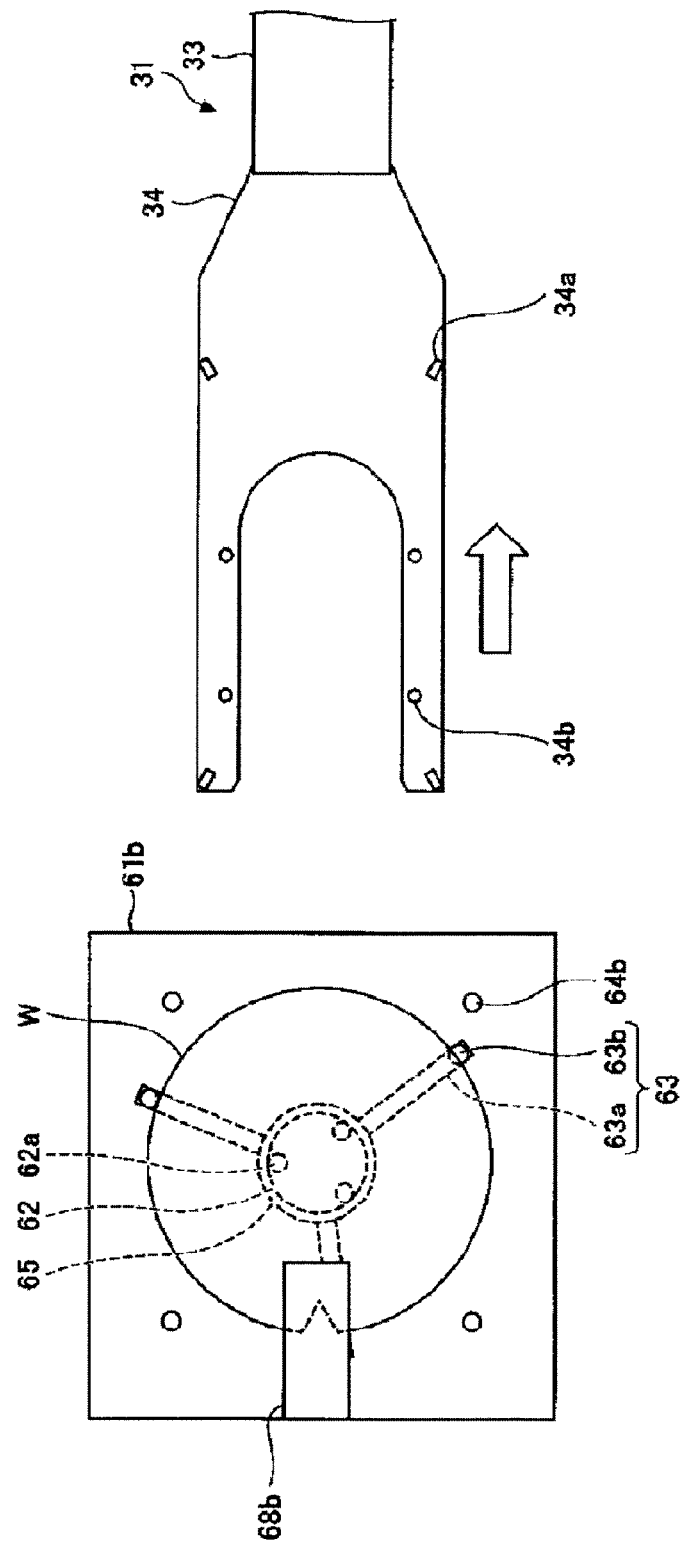
FIGS. 14A and 14B are process charts (3) showing the example of the method of positioning a wafer.
Figure 14B:
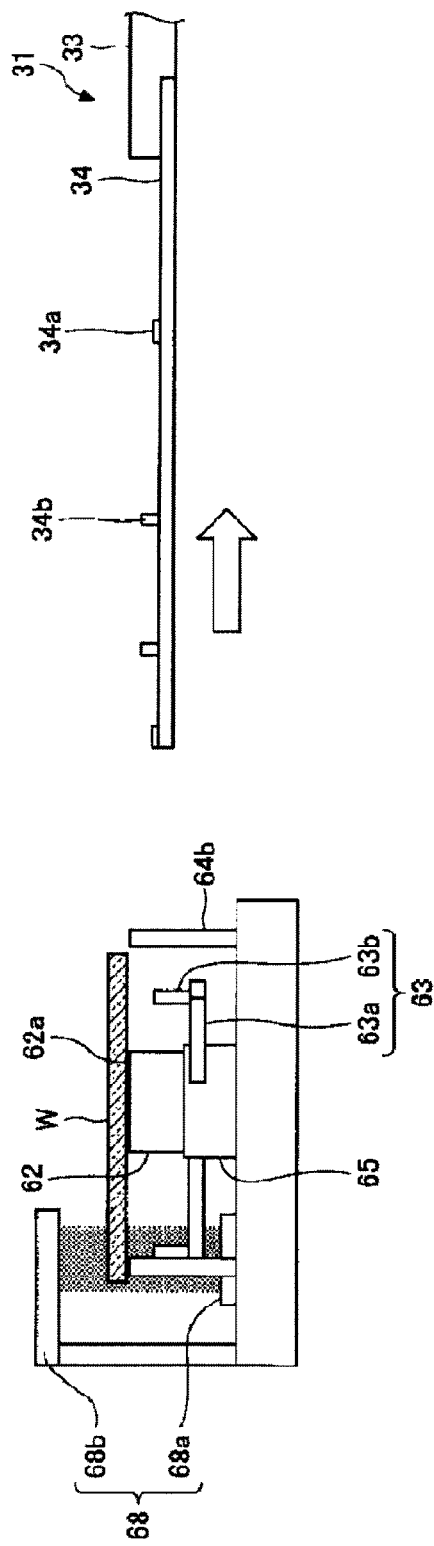

Then, the controller 100 controls the transfer device 31 to contract the multi-joint arm. 33 so that the pick 34 is moved to the outside of the aligner 60 (see FIGS. 14A and 14B).

Figure 15A:
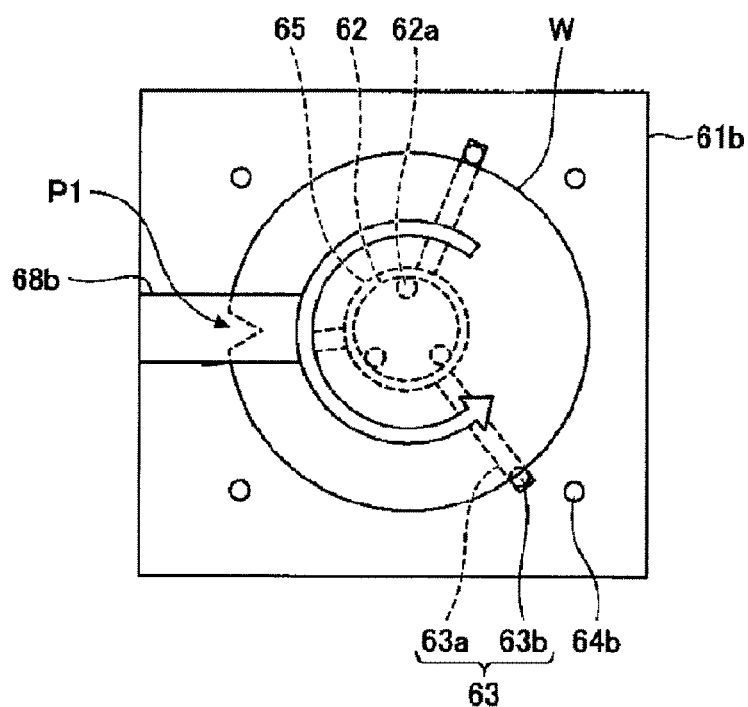
FIGS. 15A and 15B are process charts (4) showing the example of the method of positioning a wafer.
Figure 15B:
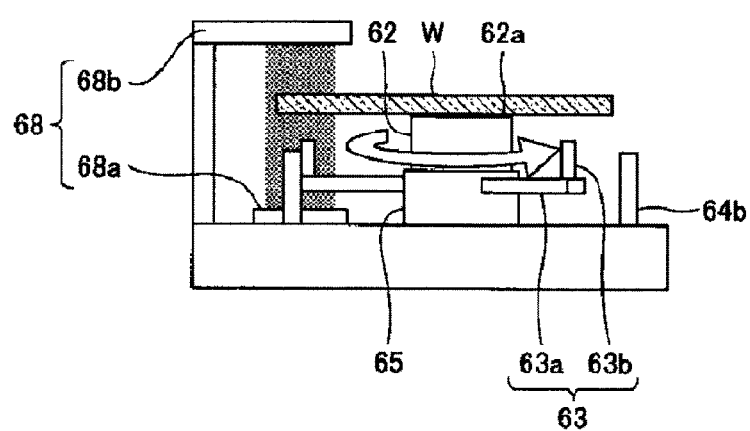

Then, the control unit 69 controls the rotation mechanism 66 to rotate the wafer holder 62 through the driving shaft 65 so that the wafer F rotates substantially once (see FIGS. 15A and 15B). Further, the control unit 69 detects the position specifying unit P1 formed at the outer circumference of the wafer W from the change in the amount of light incident on the light receiving unit 68b of the detection mechanism 68 at the time of rotating the wafer F substantially once. Further, the control unit 69 detects the deviation (eccentricity) of the center of the wafer F from the center of rotation of the wafer holder 62 from the change in the amount of light.

Figure 16:
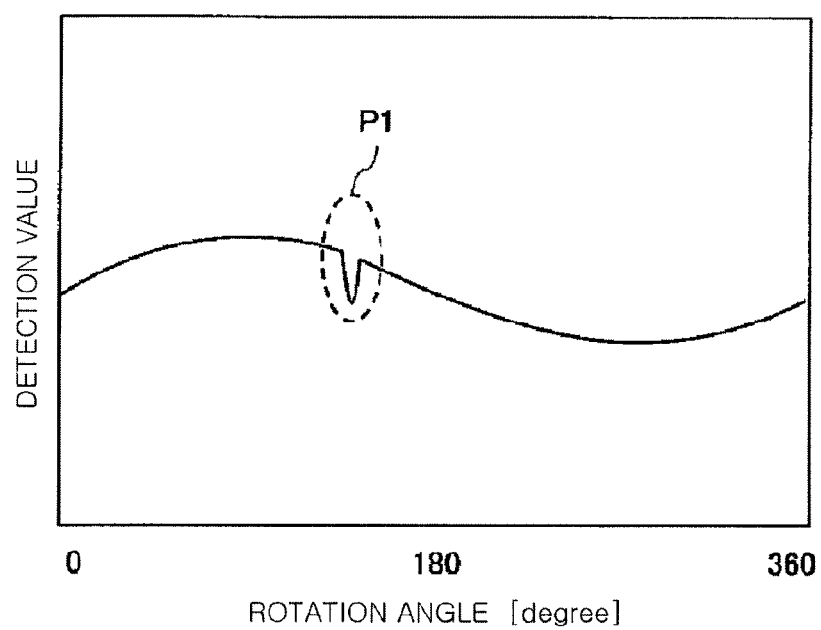
FIG. 16 explains an example of a detection signal in the case of detecting an outer circumference of a wafer.

FIG. 16 explains an example of a detection signal at the time of detecting the outer circumference of the wafer W. In FIG. 16, the vertical axis represents the detection value of the detection signal, and the horizontal axis represents the rotation angle [degrees] of the wafer W. When the wafer W is placed on the wafer holder 62 in a state where the center of the wafer W deviated from the center of rotation of the wafer holder 62, the signal detected by the detection mechanism 68 at that time of rotating the wafer W substantially once changes like a sinusoidal waveform (see FIG. 16). Further, the signal detected by the detection mechanism 68 changes in a different manner from that of the sinusoidal waveform due to the position specifying portion P1 of the wafer W. The circumferential position of the wafer W is detected by detecting the rotational position of the driving shaft 65 using an encoder (not shown), for example. Then, the control unit 69 calculate the position of the position specifying unit P1 (rotational position) and the eccentric amount and the eccentric direction of the center of the wafer W from the center of rotation of the wafer holder 62 based on the signal detected by the detection mechanism 68.

Then, the control unit 69 rotates the wafer W such that the position specifying unit P1 of the wafer W faces a predetermined direction. Further, the control unit 69 transmits the calculated eccentric amount and the calculated eccentric direction to the controller 100.

Then, the controller 100 corrects the entering position of the pick 34 with respect to the aligner 60 such that the center of the transfer device 31 and the center of the wafer W coincide with each other based on the eccentric amount and the eccentric direction received from the control unit 69. Then, the controller 100 causes the pick 34 of the transfer device 31 to enter the corrected entering position in the aligner 60 and receive the wafer W placed on the wafer holder 62.

Then, the controller 100 controls the transfer device 31 to contract the multi-joint arm 33 so that the pick 34 holding the wafer W is moved to the outside of the aligner 60 and the wafer W is unloaded from the aligner 60.

In accordance with the method of positioning the wafer W, the wafer W can be positioned using the aligner 60.

The above-described aligner 60 includes the wafer holder 62 for holding the wafer W, the FR holding pad 63b for holding the edge ring FR, and the FR elevating pins 64b that are separately provided from the FR holding pad. 63b to hold the edge ring FR. The aligner 60 further includes the rotation mechanism 66 for rotating the wafer holder 62 and the FR holding pad 63b, and the elevating mechanism 67 for raising lowering the FR elevating pins 64b. The aligner 60 further includes the detection mechanism. 66 for detecting the position of the outer circumference of the wafer W held by the wafer holder 62 and the position of the inner circumference of the edge ring FR held by the FR holding pad 63b. Therefore, the wafer W and the edge ring. FR can be positioned by one aligner 60. Accordingly, the space efficiency is improved.

In the above-described embodiments, the wafer W is an example of a substrate; the wafer holder 62 is an example of a stage; the FR holding pad 63b is an example of a first pin; the FR elevating pin 64b is an example of a second pin; and the aligner 60 is an example of a positioning apparatus.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

In the above-described embodiments, the case where the FR elevating pins 64b is raised/lowered by the elevating mechanism 67 has been described. However, the present disclosure is not limited thereto. For example, the elevating mechanism 67 may be configured such that the driving shaft 65, the wafer holder 62, and the FR holding unit 63 are integrally raised and lowered. In this case, the FR holding pad 63b is configured such that the upper end thereof is raised and lowered within a range including the height position of the upper ends of the FR elevating pins 64b.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. An apparatus for positioning comprising:
a stage to hold a substrate;
a first pin to hold an edge ring;
a second pin separately provided from the first pin and to hold the edge ring;
a rotator to rotate the stage and the first pin; and
a detector to detect a position of an outer circumference of the substrate held by the stage and a position of an inner circumference of the edge ring held by the first pin,
wherein at least one of the first pin and the second pin is configured to be raised and lowered.

2. The apparatus of claim 1, wherein the first pin rotates integrally with the stage.

3. The apparatus of claim 1, further comprising:
a driving shaft to rotatably hold the stage and the first pin.

4. The apparatus of claim 1, wherein the second pin is to be raised and lowered with respect to the first pin.

5. The apparatus of claim 4, wherein an upper end of the second pin is raised and lowered within a range including a height position of an upper end of the first pin.

6. The apparatus of claim 1, wherein an upper end of the first pin is located below an upper surface of the stage, and
the second pin is raised and lowered such that an upper end of the second pin is located below an upper surface of the stage.

7. The apparatus of claim 1, wherein the stage and the first pin are integrally raised and lowered with respect to the second pin.

8. The apparatus of claim 7, wherein an upper end of the first pin is raised and lowered within a range including a height position of an upper end of the second pin.

9. The apparatus of claim 1, wherein a position specifying portion is disposed at the outer circumference of the substrate and the inner circumference of the edge ring.

10. The apparatus of claim 9, wherein the position specifying portion disposed at the outer circumference of the substrate is a notch, and the position specifying portion disposed at the inner circumference of the edge ring is a straight portion.

11. A processing system comprising:

a chamber and a positioning apparatus to position a substrate and an edge ring to be transferred to the chamber, wherein the positioning apparatus includes:

a stage to hold the substrate;

a first pin to hold the edge ring;

a second pin separately provided from the first pin and to hold the edge ring;

a rotator to rotate the stage and the first pin; and a detector to detect a position of an outer circumference of the substrate held by the stage and a position of an inner circumference of the edge ring held by the first pin, wherein at least one of the first pin and the second pin is configured to be raised and lowered.

12. A positioning method using a positioning apparatus including a stage to hold a substrate, a pin to rotatably hold an edge ring, and a detector to detect a position of an outer circumference of the substrate and a position of an inner circumference of the edge ring, the positioning method comprising:

detecting the position of the outer circumference of the substrate using the detector while rotating the substrate in a state where the substrate is held by the stage; and detecting the position of the inner circumference of the edge ring using the detector while rotating the edge ring in a state where the edge ring is held by the pin.

* * * * *